(12) United States Patent
Nakamura et al.

(10) Patent No.: US 7,058,551 B2
(45) Date of Patent: Jun. 6, 2006

(54) HIGH-SPEED DYNAMICS COMPUTATION FOR LINK SYSTEM

(75) Inventors: Yoshihiko Nakamura, Tokyo (JP); Katsu Yamane, Kawagoe (JP)

(73) Assignee: The University of Tokyo, Tokyo (JP)

( * ) Notice: Subject to any disclaimer, the term of this patent is extended or adjusted under 35 U.S.C. 154(b) by 766 days.

(21) Appl. No.: 10/161,609

(22) Filed: Jun. 5, 2002

(65) Prior Publication Data

US 2003/0023415 A1  Jan. 30, 2003

(30) Foreign Application Priority Data

Jul. 30, 2001  (JP) .............................. 2001-228804

(51) Int. Cl.
*G06F 17/50* (2006.01)
(52) U.S. Cl. .............................................. 703/1; 703/7
(58) Field of Classification Search .................. 703/1, 703/7; 700/56
See application file for complete search history.

(56) References Cited

U.S. PATENT DOCUMENTS 5,043,929 A * 8/1991 Kramer et al. ................. 703/1
5,297,057 A * 3/1994 Kramer et al. ................. 703/7
6,004,016 A * 12/1999 Spector ........................ 700/56
6,721,668 B1 * 4/2004 Momoi et al. ................ 702/54

OTHER PUBLICATIONS

Yamane et al., "Dynamics Computation of Closed Kinematic Chains for Motion Synthesis of Human Figures," Proceedings of the 1999 IEEE/RSJ, International Conference on Intelligent Robots and Systems, pp. 1108-1114, 1999.

* cited by examiner

*Primary Examiner*—Albert W. Paladini
(74) *Attorney, Agent, or Firm*—Oliff & Berridge, PLC

(57) ABSTRACT

A high-speed forward dynamics computation for a link system wherein links are connected via joints, has: (1) first step for adding a joint one by one in series between the links to an initial link condition wherein all of the respective links are not connected via the joints so as to obtain a force of constraint acting at the joint between the links at that time; (2) second step for removing the joint in a reverse order as that of the first step so as to compute a final force of constraint at respective joints; (3) third step for computing an acceleration of respective links by utilizing applied forces obtained in the first step and the second step; and (4) fourth step for computing a joint acceleration by utilizing the accelerations of the links positioned at both ends of respective joints obtained at the third step.

4 Claims, 5 Drawing Sheets

HIGH-SPEED DYNAMICS COMPUTATION FOR LINK SYSTEM

BACKGROUND OF THE INVENTION (1) Field of the Invention

The present invention relates to a high-speed dynamics computation for a link system wherein links are connected via joints, and particularly relates to a high-speed dynamics computation for a link system used preferably for a forward dynamics computation which computes a joint acceleration in the case of applying joint displacements, joint velocities and joint torques of the link system.

(2) Prior Art Statement

Generally, a forward dynamics computation of a rigid-body link system has been widely used for a chain analysis or a design of control system in off-line operation. In the forward dynamic computation mentioned above, it has been highly required that a model having multiple degrees of freedom is simulated at a speed sufficient for interactive actions according to a widening of robot application. Such forward dynamics computation of the rigid-body link system mentioned above is applied to a motion creation of humanoid robots or human figures based on the dynamics in addition to a dynamics simulation of robots. In each of these technical fields, it is utilized as a form of software with an external interface such as an input means for joint torques or a display means for calculation results.

As an example of the forward dynamics computation of the rigid-body link system mentioned above, the following literatures 1–3 have been known. Literature 1: Anderson, K. S. and Duan, S: "Highly Parallelizable Low Order Algorithm for the Dynamics of Complex Multi-Rigid-Body Systems", AIAA Journal of Guidance, Control and Dynamics, 2000. Literature 2: Featherstone, R.: "A Divide-and-Conquer Articulated-Body Algorithm for Parallel O(log(n)) Calculation of Rigid-Body Dynamics", International Journal of Robotics Research, vol. 18, no. 9, pp. 867–892, 1999. Literature 3: Fijany, A. Sharf, I. And D'Eleuterio, G. M. T.: "Parallel O(log N) Algorithms for Computation of Manipulator Forward Dynamics", IEEE Transactions on Robotics and Automation, vol. 11, no. 8, pp. 389–400, 1995.

In the techniques described on the literatures 1–3 mentioned above, all of them intend to perform the forward dynamics computation faster by parallel computations. If the number of the links is N, a computation time becomes O(logN) by utilizing O(N) processors. However, there are following drawbacks in these techniques. That is, in the literature 1, since approximate values are obtained by a convergent calculation, accurate values cannot be obtained. In the literature 2, algorithms for serial and parallel computations are largely different from each other. In the literature 3, it is difficult to apply this technique to complex chains such as closed kinematic chains.

SUMMARY OF THE INVENTION

An object of the invention is to eliminate the drawbacks mentioned above and to provide an algorithm of high-speed dynamics computation forward for a rigid-body kinematic chains including open and closed kinematic chains.

According to the invention, a high-speed forward dynamics computation for a link system wherein links are connected via joints, comprises: (1) first step for adding a joint one by one in series between the links to an initial link condition wherein all of the links are not connected via the joint so as to obtain a force of constraint acting at the joint between the links at that time; (2) second step for removing the joint in a reverse order as that of the first step so as to compute a final force of constraint at respective joints; (3) third step for computing an acceleration of respective links by utilizing an applied force obtained in the first step and the second step; and (4) fourth step for computing a joint acceleration by utilizing the accelerations of the links positioned at both ends of respective joints obtained at the third step.

In the present invention, at first as an assembling operation, the joint is added one by one to the initial link condition wherein all the links are not connected via the joints, and the aimed link chain is finally constructed. Moreover, since the force of constraint is correct for the fully constructed system only at the final added joint, it is necessary to perform a disassembling operation, wherein the joint is cut in a reverse order, so as to take into account of the overall link chain. By performing the first step through the fourth step in this order, it is possible to perform the dynamics simulation for multiple link chain, wherein the number of the links is very large, substantially in real time.

In this invention, it should be noted that a kinematic chain constituted by a part of the links during a construction operation is hereinafter called also as "a sub-chain".

As a preferred embodiment of the present invention, there are following embodiments. That is, in the first step, an order for processing the joints is suitably selected and a parallel computation is performed by utilizing an arbitrary number of processors. Moreover, in the first step, the force of constraint acting at respective joints between the links is computed on the basis of the principle of virtual work. Further, in the first step, the force of constraint acting at respective joints between the links is computed by utilizing an inertia matrix showing a relation between forces acting at one or more links that are previously selected and an acceleration generated at the link by means of the forces mentioned above.

BRIEF DESCRIPTION OF THE DRAWING

For a better understanding of the present invention, explanations are made to the following drawings wherein.

DESCRIPTION OF THE PREFERRED EMBODIMENTS

A high-speed dynamics computation for a link system according to the invention comprises a computation of a force of constraint in a sub-chain (first step), a computation of a final force of constraint (second step), a computation of link accelerations (third step), and a computation of joint accelerations (fourth step). Hereinafter, respective steps will be explained.

(1) Computation of Force of Constraint in a Sub-chain (First Step):

One procedure is performed by adding a joint one by one to a initial link condition wherein all the respective links are not connected via the joint and by connecting two sub chains each including a part of the joints by the added joint. This procedure is repeated so as to obtain a final overall link chain. In the embodiment shown in FIG. 1, a sub-chain (A) and a sub-chain (B) are connected by means of a joint (i). The thus obtained link chain is the sub-chain as it is, and is further connected to the other sub-chains via links (l), (m) and (n). In the first step, every time the joint is added, the force of constraint (fi) generated at the joint (i) is computed. In order to obtain the force of constraint (fi), the computation based on the principle of virtual work is preferred.

Figure 2:
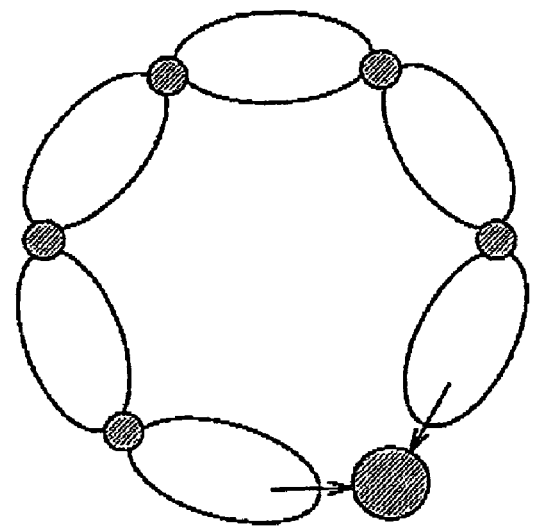
FIG. 2 is a schematic view for explaining a handling of a closed link system in the case of the high-speed dynamics computation for the link system according to the invention.

In the case of constructing a closed kinematic chain, one link in the closed loop must be connected in the same sub-chain. That is, when the joint is added in the first step, it is fundamental to connect two different sub-chains via the added joint However, in the case of the closed link chain, as shown in FIG. 2, it is possible to deal with this case in such a manner that two links in the same sub-chain are connected via the added joint.

(2) Computation of Final Force of Constraint (Second Step):

In the first step, it is possible to obtain all the forces of constraint acting at the joints in the overall link chain. However, since the force of constraint is correct for the fully constructed system only at the final added joint, it is necessary to perform a disassembling operation, wherein the joint is cut in a reverse order, so as to take into account of the overall link chain. To this end, the second step is performed. That is, the force of constraint in a complete link system is computed at respective joints. This computation is performed by repeating the procedure such that the joint is cut in a reverse order as that of the first step and the force of constraint at the joint to be cut next is decided by utilizing the decided force of constraint at the joint cut just previously. In the embodiment shown in FIG. 1, if the forces of constraint (fl), (fm) and (fn) are obtained by cutting the joints (l), (m) and (n), the force of constraint (fi) at the joint (i) can be obtained. Then, the joint (i) is cut. If this procedure is achieved, it is possible to determine forces of constraint at all the joints.

(3) Computation of Link Acceleration (Third Step):

In the first step and the second step, since all the applied forces acting at respective links can be obtained, the acceleration of respective links is computed by consolidating the force of constraint acting at respective links.

(4) Computation of Joint Acceleration (Fourth Step):

The joint acceleration is computed by utilizing relative link accelerations at both sides of respective joints that are obtained in the third step.

In the first step mentioned above, in order to obtain the force of constraint (fi) generating at the joint (i) every time the joint is added, it is preferred to consider an inertia matrix as the link chain That is, every time one joint is added, the inertia matrix showing a relation between the force of constraint and the acceleration acting at the joint (i) and the inertia matrix showing a relation between the forces of constraint and the accelerations acting at the joints (i), (l), (m) and (n) are computed, and the thus computed internal matrixes are utilized. Hereinafter, the inertia matrix used here will be explained in detail.

Figure 3:
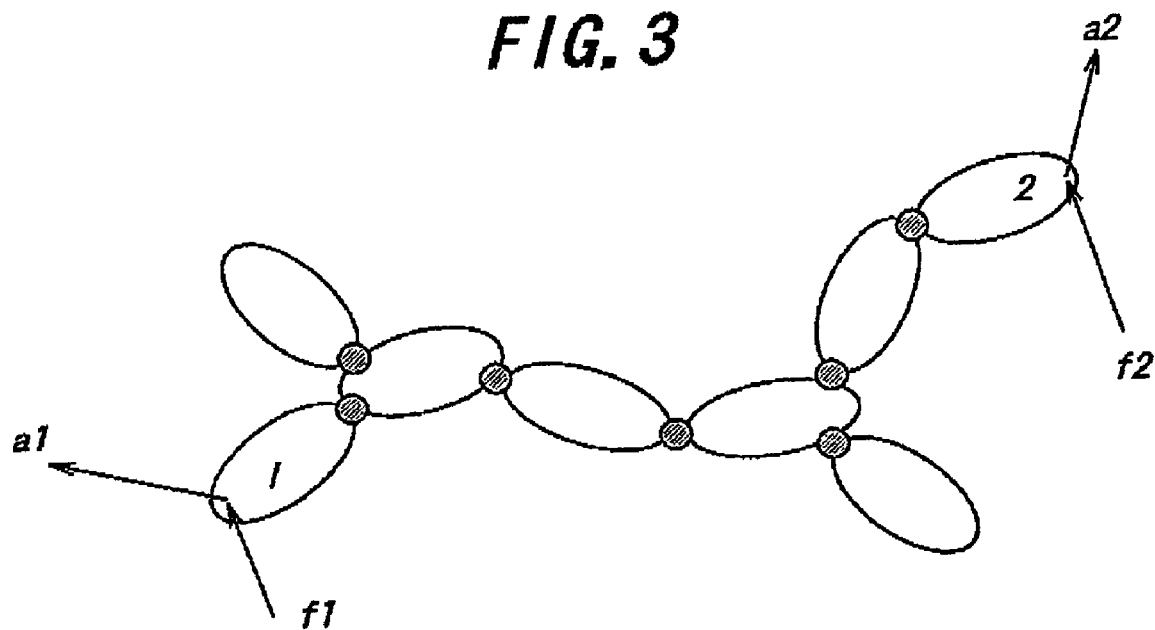
FIG. 3 is a schematic view for explaining an inertia matrix of the link chain with taking into account of link continuity in the case of the high-speed dynamics computation for the link system according to the invention.

In the link system as shown in FIG. 3, if it is assumed that accelerations and angular accelerations $a_1$ and $a_2$ are generated by applying forces and moments $f_1$ and $f_2$ to the links (1) and (2), a relation between $f_1$, $f_2$ and $a_1$, $a_2$ is shown as the following formula (1).

$$\begin{pmatrix} \Gamma_{11} & \Gamma_{12} \\ \Gamma_{21} & \Gamma_{22} \end{pmatrix} \begin{pmatrix} f_1 \\ f_2 \end{pmatrix} = \begin{pmatrix} a_1 \\ a_2 \end{pmatrix} \qquad \text{[formula 1]}$$

Figure 4:
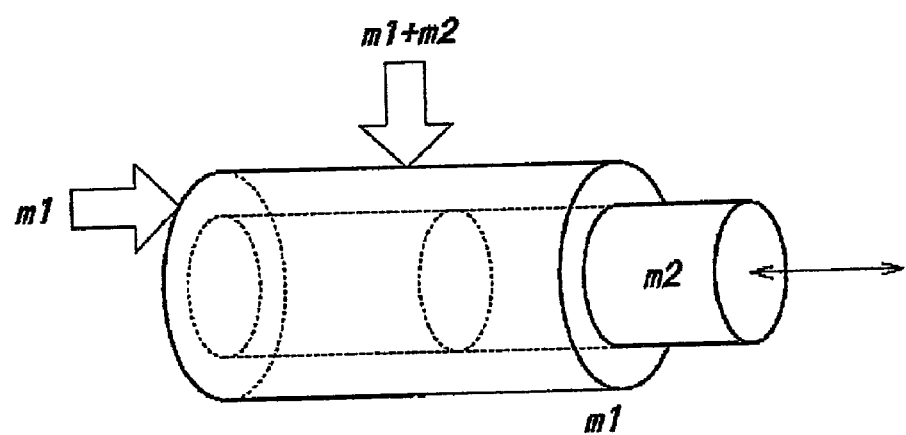
FIG. 4 is an example showing a relation between the masses and inertia matrices of the links and the inertia matrix taking into account the constraint condition of the joint.

Here, $\Gamma_{ij}$ (I, j=1, 2) is an inertia inverse matrix computed in the step 1, and thus an inertia matrix can be obtained by computing an inverse matrix thereof. This inertia matrix is computed with taking into account of the constraint condition at the joint in addition to masses and inertia matrices of the links. FIG. 4 is a simple example showing a relation between the masses and inertia matrices of the links and the inertia matrix with taking into account of the constraint condition of the joint. In the embodiment shown in FIG. 4, a link having mass of $m_1$ and a link having mass of $m_2$ are connected by the joint in such a manner that they are mover rightward and leftward. In this link chain, when a force is applied to the link having mass of $m_1$ in up and down direction, a total mass is $m_1+m_2$ since two links are moved simultaneously. On the other hand, when a force is applied to the link having mass of $m_1$ in rightward and leftward direction, a total mass is $m_1$ since a constraint force is not applied to the link having mass of $m_2$ in this direction.

Figure 5:
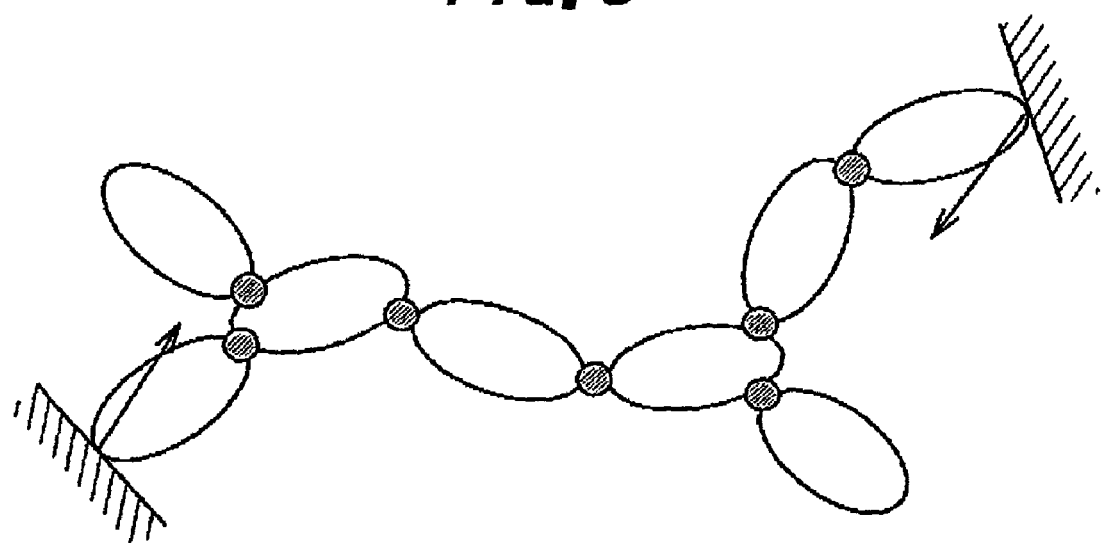
FIG. 5 is a schematic view for explaining the link chain wherein link motions are restricted externally in the case of the high-speed dynamic computation for the link system according to the invention.

The inertia matrix mentioned above showing the overall link chain is effective for other purposes except for computing the constraint forces generated in the link chain. For example, when the link chain is in contact with external construction members as shown in FIG. 5, there arises a unilateral constraint condition such that a connecting force is not served in a direction wherein the external construction member pulls the link. Therefore, it is necessary to evaluate whether the connecting force is actually generatable or not by computing the constraint force at the connecting point. In this case, since the movement of the link in contact with the external construction member i.e. $a_1$ and $a_2$ is determined by the constraint, it is possible to compute the contacting forces $f_1$ and $f_2$ by utilizing the formula (1) mentioned above.

As mentioned above, in the high-speed forward dynamics computation for the link system according to the invention, the procedure of connecting different two sub-chains by adding one joint is repeated except for the case such that the closed loop is formed. Since the sub-chains before connecting are dynamically independent with each other, prior procedures can be performed in parallel at respective sub-chains, In this case, if these procedures are to be performed by respective CPUs or computers, a total computation time is same as that of one sub-chain, and thus it is possible to realize a shortening of computation time.

Figure 1:
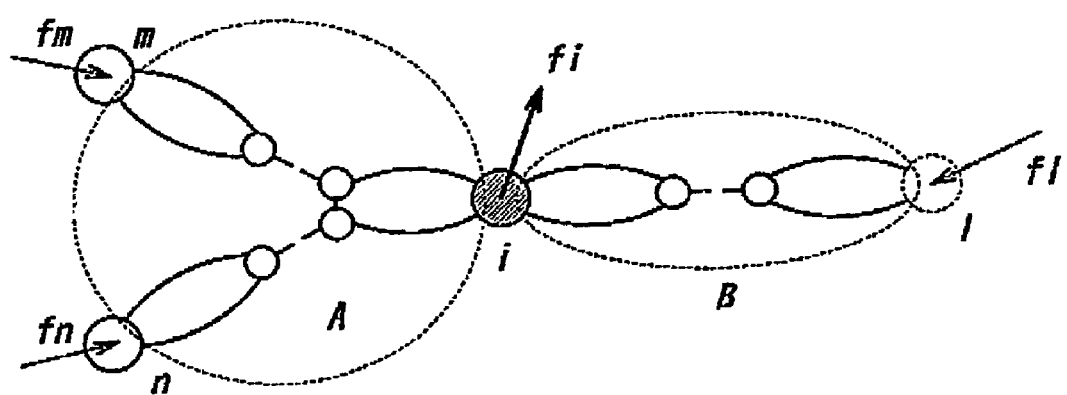
FIG. 1 is a schematic view for explaining a connection of sub-chains in the case of a high-speed dynamics computation for a link system according to the invention.

In the embodiment shown in FIG. 1, the procedures at the sub-chains (A) and (B) prior to adding the joint (i) can be performed in parallel, and thus the computation time is substantially same as that of the case wherein either one procedures is performed. Therefore, in the case such that a sufficient number of CPUs or computers can be provided, in order to minimize the computation time of the parallel computation, it is preferred to achieve a scheduling such that the sub-chains generated in midcourse are to be independent with each other as much as possible. Such a scheduler is included in the computation.

On the other hand, if such a scheduling is performed, the number of the joints connecting respective sub-chains to the other sub-chains (corresponding to the joints (l), (m) and (n) in FIG. 1) is increased. In this case, this means an increasing of the computation amount when two sub-chains are connected. Therefore, in the computer environment such that there is only one CPU or computer and only the serial computation is possible, such a scheduling mentioned above is not preferred. In this case, it is preferred to perform a scheduling such that the number of the joints connecting respective sub-chains to the other sub-chains is minimized as much as possible. Such a scheduler is included in the computation.

Figure 6:
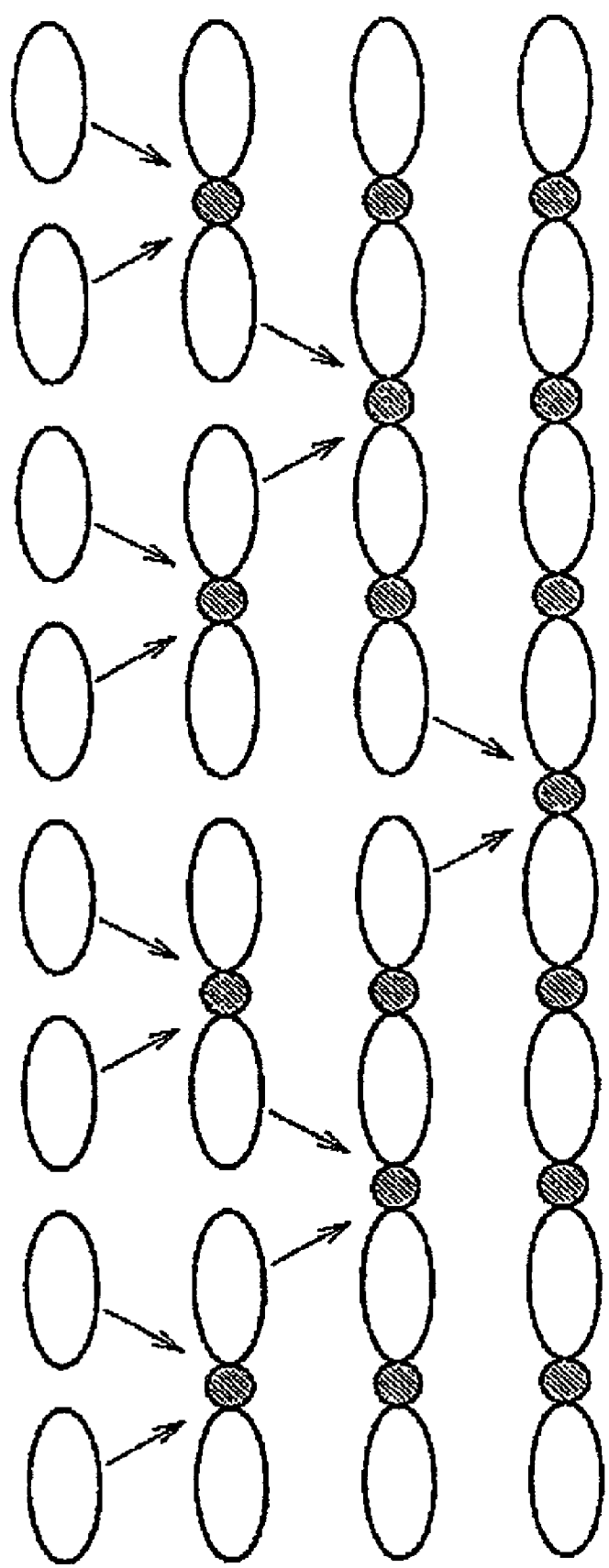
FIG. 6 is a schematic view for explaining a processing order optimized for parallel computation.
Figure 7:
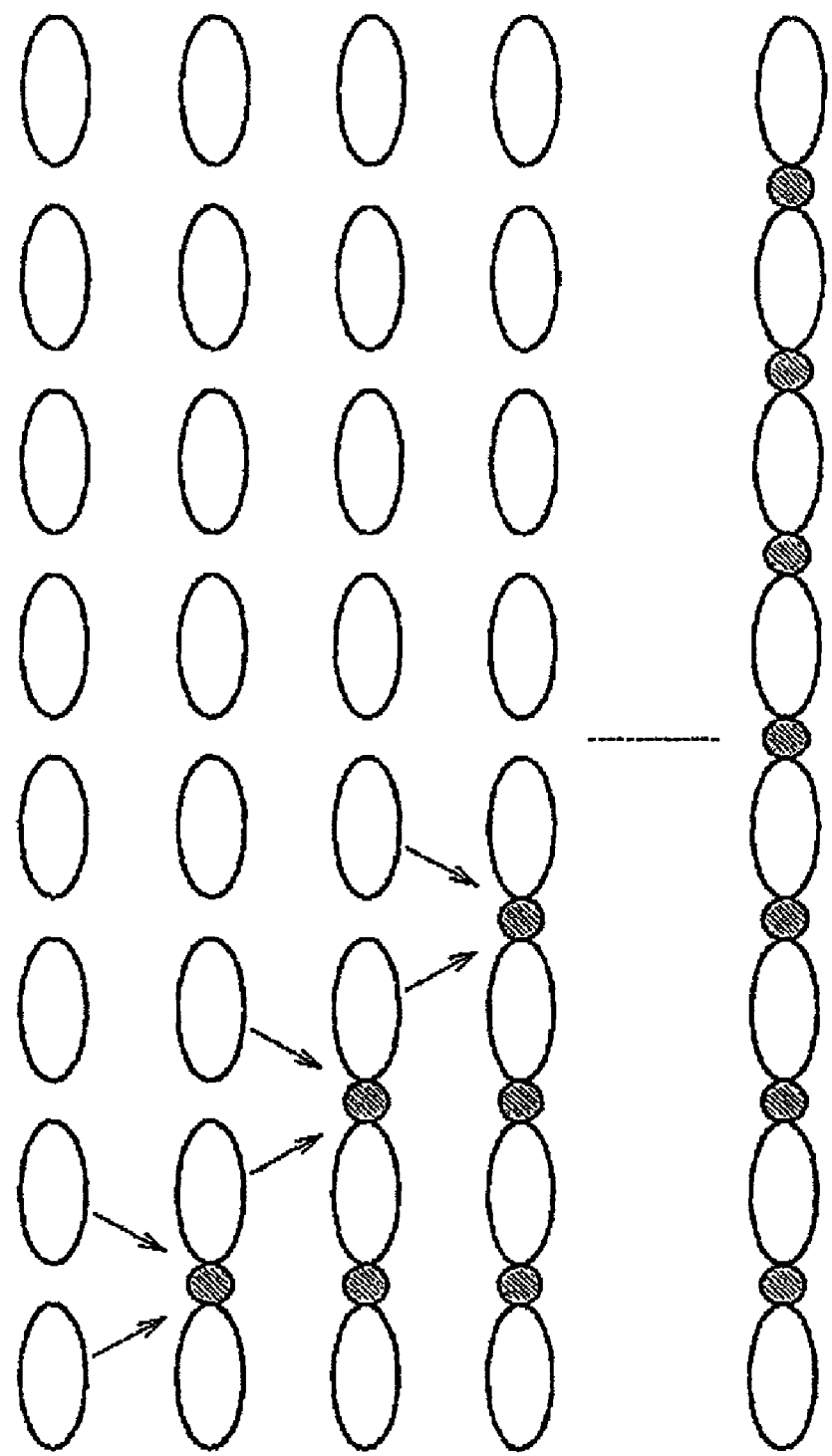
FIG. 7 is a schematic view for explaining a processing order optimized for serial computation.

In the serial kinematic chain having 8 links and 7 joints, the procedure optimized for the parallel computation is shown in FIG. 6, and the procedure optimized for the serial computation is shown in FIG. 7. In the case of comparing the embodiments respectively shown in FIG. 6 and FIG. 7, if it is assumed that a time required for adding one joint is same, it is understood that the computation time of the parallel computation shown in FIG. 6 is faster than that of the serial computation shown in FIG. 7 by the shortening steps required for computing.

In the case of actually utilizing a computation program, it is less practical to provide several programs corresponding to computer environments. In this respect, the computation according to the invention do not have a theoretical difference even in performing the serial computation and the parallel computation, and it is easy to change the serial computation and the parallel computation. Therefore, it is possible to perform a program development corresponding to various computer environments.

By utilizing the high-speed forward dynamics computation for the link system according to the invention, it is possible to perform the dynamics simulation of the link chain having extreme number of links at a speed substantially close to the real time. In this invention, the procedures are as follows.

Initial joint displacements and joint velocities are set

Computation starts. During the computation, ever-changing joint torques are inputted.

By integrating the computed acceleration and the velocity, the joint velocities and displacements are up-dated after one cycle of computation. These up-dated data are to be used for control and else.

As clearly understood from the explanations mentioned above, based upon the known computation algorithms an extremely large computations are required for forward dynamics computation of complex kinematic chains including closed ones. It is possible to perform this dynamics computation at a high-speed according to the computation of the invention. Moreover, since an increase of the computation time is little as the number of links is increased, it is possible to perform the forward dynamics computation at a relatively short time even for kinematic chains having a few hundreds degrees of from. Actually, as compared with the known computation applicable to such complex kinematic chains, it is confirmed that the computation time by the serial computation for a kinematic chain having about 40 degrees of freedom is shortened by about one-third. In addition, since not only the acceleration at respective joints but also the constraint force at respective joints can be directly computed, it is possible to apply the computation according to the invention to a simulation of force sensor and so on.

Heretofore, entirely different computational algorithms are often applied to the forward dynamics computation by the serial computation and the forward dynamics computation by the parallel computation. However, according to the computation of the invention, it is not necessary to differentiate the serial computation and the parallel computation, and it is possible to change the number of CPUs or computers by only varying the connecting/cutting procedure order of the joints. Therefore, it is possible to perform a general programming.

What is claimed is:

1. A high-speed forward dynamics computation for a link system wherein links are connected via joints, comprising:
   (1) first step for adding a joint one by one in series between the links to an initial link condition wherein all of the respective links are not connected via the joint so as to obtain a force of constraint acting at the joint between the links at that time;
   (2) second step for removing the joint in a reverse order as that of the first step so as to compute a final force of constraint at respective joints;
   (3) third step for computing an acceleration of respective links by utilizing applied forces obtained in the first step and the second step; and
   (4) fourth step for computing a joint acceleration by utilizing the accelerations of the links positioned at both ends of respective joints obtained at the third step.

2. The high-speed forward dynamics computation for a link system according to claim 1, wherein, in the first step, an order for processing the joints is suitably selected and a parallel computation is performed by utilizing an arbitrary number of processors.

3. The high-speed forward dynamics computation for a link system according to claim 1, wherein, in the first step, the force of constraint acting at respective joints between the links is computed on the basis of the principle of virtual work.

4. The high-speed forward dynamics computation for a link system according to claim 1, wherein, in the first step, the force of constraint acting at respective joints between the links is computed by utilizing an inertia matrix showing a relation between forces acting at one or more links which are previously selected and an acceleration generated at the link by means of the forces mentioned above.

* * * * *